United States Patent
Maeda et al.

(10) Patent No.: US 6,169,282 B1
(45) Date of Patent: Jan. 2, 2001

(54) DEFECT INSPECTION METHOD AND APPARATUS THEREFOR

(75) Inventors: Shunji Maeda; Kenji Oka; Hiroshi Makihira; Yasuhiko Nakayama; Minoru Yoshida, all of Yokohama; Yukihiro Shibata, Fujisawa; Chie Shishido, Yokohama, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/181,851

(22) Filed: Oct. 29, 1998

(30) Foreign Application Priority Data

Oct. 29, 1997 (JP) .................................................... 9-296649

(51) Int. Cl.[7] .............................. H01J 37/28; G06K 9/03
(52) U.S. Cl. .......................... 250/310; 250/307; 356/394; 382/145; 382/149
(58) Field of Search .................................... 250/310, 307; 356/394; 382/145, 149

(56) References Cited

U.S. PATENT DOCUMENTS 4,803,358 * 2/1989 Kato et al. ............................ 250/310
4,805,123 * 2/1989 Specht et al. ........................ 382/144

FOREIGN PATENT DOCUMENTS 55-74409 * 6/1980 (JP) .

* cited by examiner

Primary Examiner—Jack Berman
(74) Attorney, Agent, or Firm—Antonelli, Terry, Stout & Kraus, LLP

(57) ABSTRACT

A defect inspection method and apparatus therefor for a pattern to be inspected having a plurality of chips formed so as to be identical detect an image signal of a pattern to be inspected and when the image signal is to be compared with a detected image signal of an adjacent or separated pattern to be inspected on the substrate, convert the gray level so that the brightness of each of two image signals for comparing one or both of the detected image signals is almost identical in the local region by linear conversion having a gain and offset, and when a pattern is inspected using it, highly sensitive defect inspection for a pattern to be inspected for detecting a defect of a semiconductor wafer can be realized.

32 Claims, 18 Drawing Sheets

FIG. 5

$$F = \begin{bmatrix} 1-\alpha-\beta & \alpha \\ \beta & 0 \end{bmatrix}$$

$$F' = \begin{bmatrix} 0 & \beta \\ \beta & 1-\alpha-\beta \end{bmatrix}$$

f(x,y)

g(x,y)

|f(x,y) -g(x,y)|

SUBTRACTED IMAGE g(x, y)

BRIGHTNESS HISTOGRAM OF g(x, y)

f(x, y)

BRIGHTNESS HISTOGRAM OF f(x, y)

a*g(x, y) + b

BRIGHTNESS HISTOGRAM OF |a*g(x, y) + b|

※ EACH OF a, b IS OBTAINED AT EACH POINT IN THE LOCAL AREA OF THE IMAGE

SUBTRACTED IMAGE 1 (3X3)

SUBTRACTED IMAGE 1 (5X5)

SUBTRACTED IMAGE 1 (7X7)

SUBTRACTED IMAGE 4 (7X7, WEIGHTED)

FIG. 20

| | -1 | 0 | 1 |
|---|---|---|---|
| -1 | $8.28 \times 10^{11}$ | $1.56 \times 10^{11}$ | $9.07 \times 10^{11}$ |
| 0 | $8.55 \times 10^{11}$ | 0 | $8.59 \times 10^{11}$ |
| 1 | $9.0 \times 10^{11}$ | $1.55 \times 10^{11}$ | $8.33 \times 10^{11}$ |

FIG. 21

| | -1 | 0 | 1 |
|---|---|---|---|
| -1 | 967323 | 742941 | 921727 |
| 0 | 953922 | 732608 | 939418 |
| 1 | 950797 | 728523 | 937704 |

DEFECT INSPECTION METHOD AND APPARATUS THEREFOR

BACKGROUND OF THE INVENTION

1. Field of the Invention

The present invention relates to visual inspection for detecting a defect of a pattern to be inspected and more particularly to a defect inspection method and apparatus therefor for a pattern to be inspected in a semiconductor wafer or liquid crystal display.

2. Description of the Prior Art

Conventionally, this kind of inspection apparatus, like the art described in Japanese Patent Laid-Open Application No. 55-74409, detects an image of a pattern to be inspected by an image sensor such as a line sensor by moving the pattern to be inspected, compares the aforementioned detected image signal with an image signal delayed by the predetermined time in the gray level, and recognizes a mismatch between them as a defect.

Furthermore, as described in Japanese Patent Publication 8-10463, the comparison is made by lining up two images.

The aforementioned conventional defect recognition method will be explained in detail with reference to FIGS. 14 to 17. FIG. 14 is a schematic illustration of a memory mat and peripheral circuit in a memory chip of a pattern to be inspected by the prior art, and FIG. 15 shows a brightness histogram in the memory mat and peripheral circuit in the memory chip shown in FIG. 14, and FIG. 16 shows drawings indicating the cutline of the process of flattening the surface of multi-layered film on a semiconductor wafer by the CMP (chemical mechanical polishing) process.

As shown in FIG. 14, many memory chips 20 are arranged and formed on a semiconductor wafer. Each memory chip 20 is broadly divided into a memory mat 21 and a peripheral circuit 22. The memory mat 21 is a collection of small repetitive patterns (cells) and the peripheral circuit 22 is basically a collection of random patterns. However, in many cases, as viewed minutely, it can be regarded as a collection of repetitive patterns having a plurality of different cell pitches.

FIG. 15 shows a brightness distribution in the memory mat 21 and the peripheral circuit 22 in the memory chip 21 shown in FIG. 14, that is, the frequency (histogram) for the brightness in the memory chip as a maximum of 1024 gray levels in a 10-bit constitution. However, the memory mat 21 has a high pattern density and is generally dark. On the other hand, the peripheral circuit 22 has a low pattern density and is generally bright.

With respect to the brightness distribution on the semiconductor wafer subjected to the CMP process as shown in FIG. 16, the circuit pattern in the memory mat 21 is different in brightness depending on the pattern film thickness as indicated by the histogram shown in FIG. 17. In the drawing, the wiring layer is deposited and then flattened by the CMP process. In such a pattern, the film thickness varies locally and gray scale differences are easily generated. In such a pattern, the patterns shown in FIGS. 15 and 17 are compared in the pattern brightness and when the threshold is set so as to prevent a maldetection of a difference in brightness, the defect detection sensitivity will be extremely lowered. Such a difference in brightness may be offset to a certain extent if illumination light with a wide wave length band is used. However, in a pattern subjected to the CMP process, it is limited because the brightness variation is great. Therefore, it is desirable to detect a minute defect from a pattern with different brightness.

Furthermore, conventionally, the sum of squares of differences in two images is calculated and the image dislocation is detected by fitting a parabolic sphere surface to it. However, the method does not guarantee a match between the two images to be compared and optimum matching is desired for comparison. FIG. 20 shows experimental results when the sum of squares of differences in each pixel of two images (f(x,y) shown in FIG. 6 described later) is obtained by shifting one of the images within a range of ±1 pixel in the x and y directions. The transverse axis indicates the x direction and the ordinate axis indicates the y direction. Each value shown in the drawing indicates the sum of squares of differences. In this case, the same image (f(x,y) shown in FIG. 6) is used. Namely, as a sum of squares of differences, $\Sigma(f(x,y)-f(x\pm1, y\pm1))^2$ is calculated. As shown in FIG. 20, even in the same image, the sum of squares of differences is not symmetrical about (0,0) and has an asymmetry of about 0.6%. Since the same image is used, the sum of squares of differences is 0 at (0,0). Therefore, even if a parabola is fitted to this data and a position where the sum of squares of differences is minimized with a resolution less than the pixel dimension is obtained, the accurate dislocation, (0,0) in this case cannot be detected. Furthermore, in a wafer of the CMP process, the brightness is different. The effect of the difference in brightness is shown. In this case, an image and another image having a brightness 1.1 times of that of the image are used. The value of 1.1 times is normal or smaller as a variation of the brightness of a CMP wafer. Experimental results are shown in FIG. 21. The sum of absolute values of differences is shown. The minimum position is (0,1). There are great errors not only with a resolution less than the pixel dimension but also on the pixel level. The sum of squares of differences has the same tendency. The drawing shows that the image dislocation cannot be accurately obtained from these data. Needless to say, the case of 1.05 times also has the same tendency. The method for fitting a parabolic sphere surface to the sum of squares of differences and obtaining the minimum position from it like this may be called a method having an extremely large error.

SUMMARY OF THE INVENTION

An object of the present invention is to eliminate the difficulties of the prior arts mentioned above and to provide a defect inspection method for a pattern to be inspected for making capable of inspecting by comparison of patterns different in brightness and always inspecting a defect in high sensitivity and high reliability.

Another object of the present invention is to provide a defect inspection method for a pattern to be inspected using a highly accurate image matching method.

Still another object of the present invention is to provide a highly sensitive defect inspection method even for a wafer pattern subjected to the CMP process.

To accomplish these objects, the defect inspection method and apparatus therefor of the present invention images a sample having a plurality of patterns formed so as to be identical, detects an image of the first pattern arranged on the sample and an image of the second pattern, converts the gray level of at least one of the detected image of the first pattern and the detected image of the second pattern, and detects a defect of at least the first or second pattern using the one image whose gray level is converted and the image of the other aforementioned first or second pattern different from the one image.

More concretely, to accomplish the aforementioned objects, in the defect inspection method and apparatus therefor for a pattern to be inspected of the present invention which images a substrate having a plurality of patterns formed so as to be identical, detects an image of the first pattern arranged on this substrate, stores the detected image of the first pattern, images the substrate, detects an image of the second pattern formed so as to be identical with the first pattern, corrects the dislocation between the stored image of the first pattern and the detected second image in pixel units, and detects a pattern defect using the stored image of the first pattern and the detected second image in which the dislocation is corrected in pixel units, before detecting a pattern defect, the gray level of at least one of the stored image of the first pattern and the detected image of the second pattern is converted.

The conversion of gray level is to convert the brightness of each of two image signals to be compared so as to be almost identical by linear conversion having a gain and offset.

Furthermore, the gain and offset which are parameters of conversion of gray level are decided so as to minimize the error of square of the brightness of each of two images to be compared.

Both image of the first pattern and image of the second pattern to be detected are optical images.

Both image of the first pattern and image of the second pattern to be detected are secondary charged particle images.

Each pattern is a chip having a mat comprising a repetitive pattern region which is a cell and a peripheral circuit which is a non-repetitive pattern region.

Furthermore, each chip is subjected to the CMP (chemical mechanical polishing) process.

Furthermore, image matching is executed by convoluting two images with a dual filter, calculating the filter coefficient so as to minimize the sum of squares of differences, and convoluting the two images with the filter on the basis of it.

The foregoing and other objects, advantages, manner of operation and novel features of the present invention will be understood from the following detailed description when read in connection with the accompanying drawings.

BRIEF DESCRIPTION OF THE DRAWINGS

FIG. 5 is a drawing showing an example of a dual filter.

FIG. 20 is a drawing showing the sum of squares of differences between two images.

FIG. 21 is a drawing showing the sum of absolute values of differences between two images.

DETAILED DESCRIPTION OF THE PREFERRED EMBODIMENTS

The embodiments of the present invention will be explained hereunder with reference to FIGS. 1 to 13.

Embodiment 1

Figure 1:
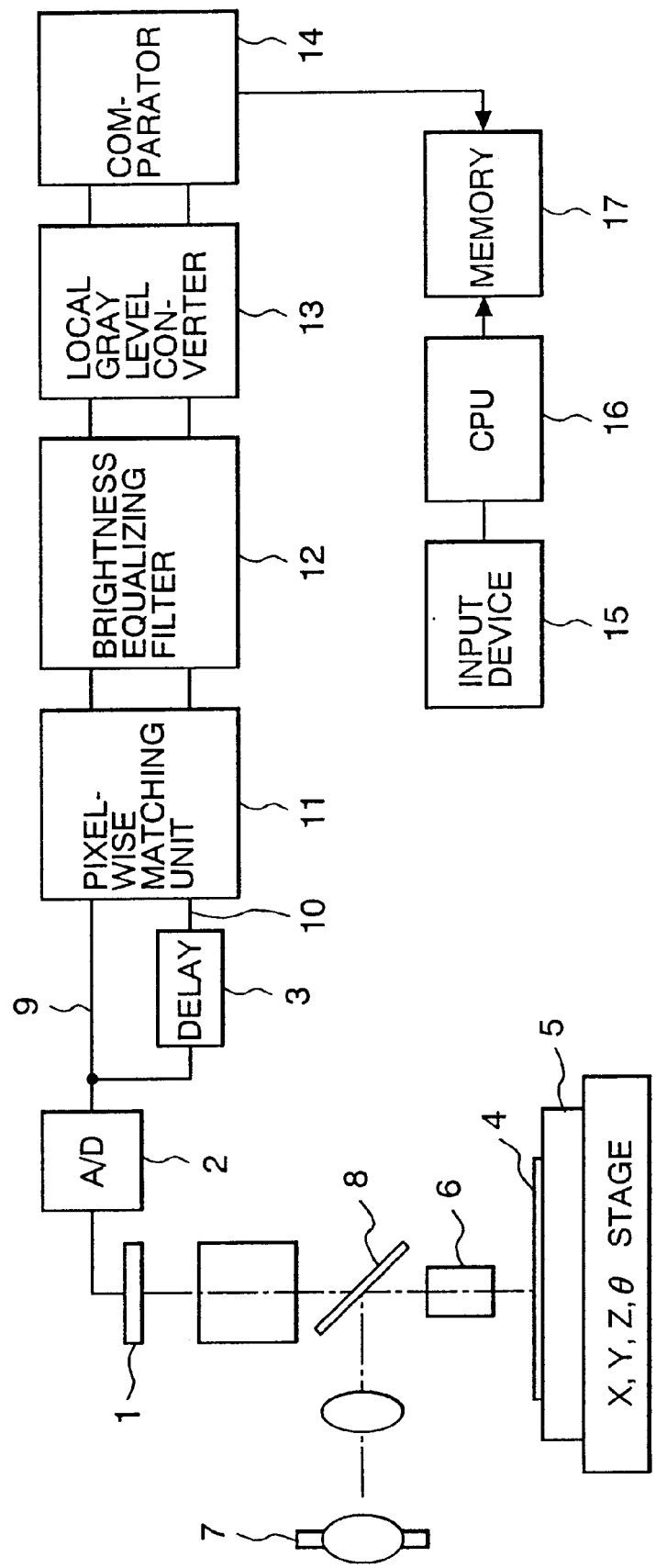
FIG. 1 is a block diagram of a defect inspection apparatus for a pattern to be inspected of an embodiment of the present invention.

The defect inspection method and apparatus therefor for a pattern to be inspected of the present invention will be explained. FIG. 1 is a block diagram of a defect inspection apparatus for a pattern to be inspected of an embodiment of the present invention.

In this embodiment, an example of a circuit pattern formed on a semiconductor wafer will be explained as a pattern to be inspected.

In FIG. 1, numeral 1 indicates an image sensor for outputting the brightness of reflected light from a semiconductor wafer 4 which is a pattern to be inspected, that is, a gray level image signal depending on the gray level, 2 an A/D converter for converting the gray level image signal obtained from the image sensor 1 to a digital image signal 9, 3 a delay memory for delaying the gray level image signal, 4 a semiconductor wafer having a pattern to be inspected, 5 a stage moving in the X direction, Y direction, Z direction, and θ direction (rotation) for loading the semiconductor wafer 4 having a pattern to be inspected, 6 an object lens for the semiconductor wafer 4, 7 an illumination light source for illuminating the semiconductor wafer 4 having a pattern to be inspected, 8 a half mirror for reflecting illumination light, irradiating it to the semiconductor wafer 4 via the object lens 6, and transmitting reflected light from the semiconductor wafer 4, and 9 a digital image signal to which the gray level image signal is converted by the A/D converter. Therefore, the apparatus is structured so that illumination light from the illumination light source 7 is reflected and for example, bright field illumination is executed for the semiconductor wafer 4 via the object lens 6.

Numeral 3 may be a delay memory for delaying the image signal 9 by storing the pitch of repetitive one cell or a plurality of cells or a delay memory for delaying the image signal 9 by storing the pitch of repetitive one chip or a plurality of chips.

Numeral 11 indicates a pixel-wise matching unit for positioning the digital image signal 9 and a delayed image signal 10 and in this embodiment, the unit detects the dislocation amount where the gray level difference is minimized in pixel units, shifts one image on the basis of this dislocation amount, and positions two images. Images are continuously detected by the image sensor, divided, for example, every 256 lines, and positioned in this unit. Numeral 12 indicates a brightness converter for converting image signals with different brightness so as to equalize each brightness. In this embodiment, a batch filtering operation is performed for a whole image so as to equalize each brightness.

Numeral 13 indicates a gray level converter for converting the gray levels of image signals with different brightness so as to equalize each brightness. In this embodiment, linear conversion is executed for each pixel by the gain and offset so as to equalize the brightness.

Obtained image signals are compared by a comparator 14 and a mismatch is detected as a defect.

In the aforementioned embodiment, bright field illumination is used as illumination. However, the illumination is not limited to it. Any illumination such as dark field illumination or annular illumination which can be used as illumination for a microscope is acceptable. Needless to say, illumination by an electron beam may also be applicable.

It is possible to execute an inspection several times by changing these illumination conditions, calculate the logical OR of inspection results of several times, and use it as a final result. Or, it is also possible to calculate the AND, surely discriminate as a defect, and diagnose the process, for example, by this defect distribution or the number of defects. In this case, review for performing visual check for the mismatched portion is made unnecessary and the operation can be simplified.

Figure 2:
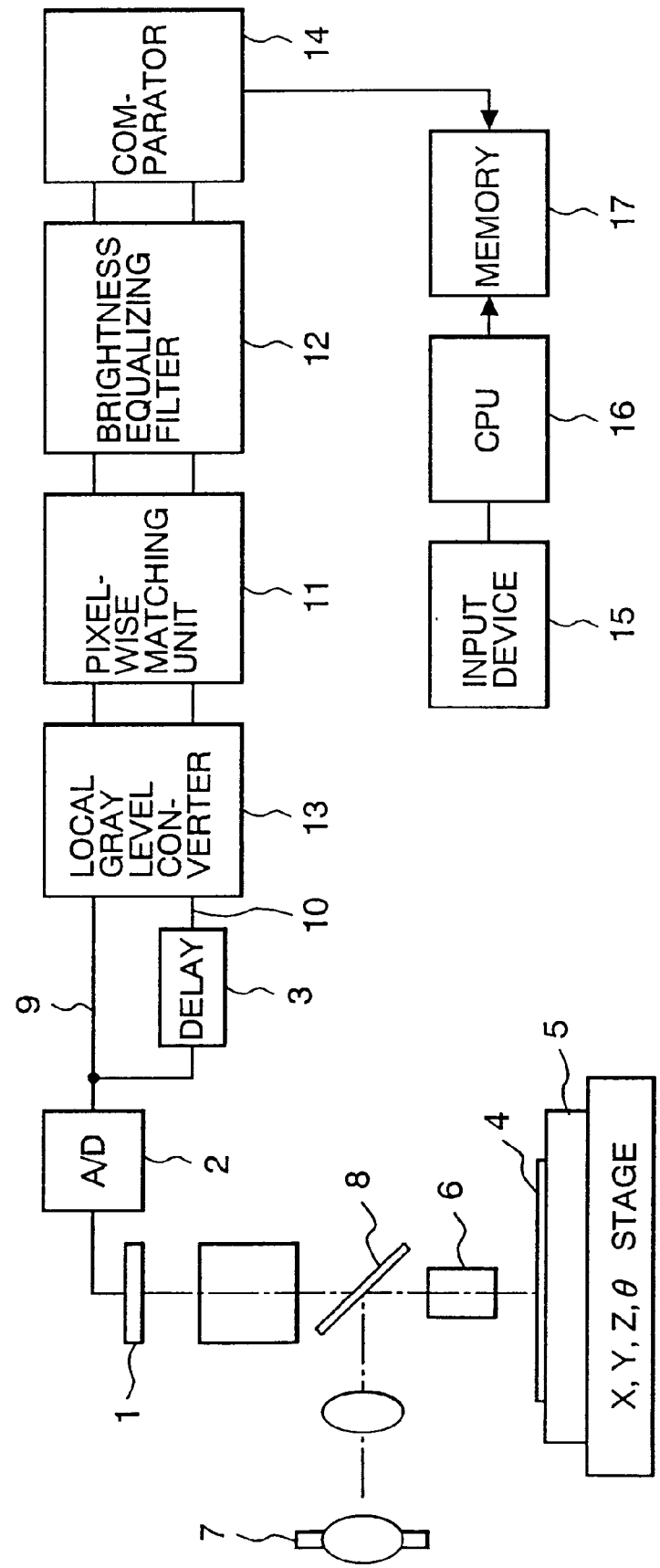
FIG. 2 is a block diagram of a defect inspection apparatus for a pattern to be inspected of an embodiment of the present invention.

Next, the operation of an inspection apparatus having the aforementioned constitution will be explained by referring to FIGS. 1 to 5. FIGS. 1 and 2 are different in the processing order.

In FIG. 1, the stage 5 is scanned in the X direction by illumination light focused by the object lens 6, and the target region of the semiconductor wafer 4 having a pattern to be inspected is moved at a constant speed, and the pattern to be inspected formed on the semiconductor wafer 4, that is, the brightness information (gray level image signal) of the memory mat 21 and the peripheral circuit 22 in the chip 20 is detected by the image sensor 1.

When the movement of one row ends, the target region moves to the neighboring row in the Y direction at a high speed and is positioned. Namely, by repeating the constant speed motion and high speed motion, the pattern is inspected. Needless to say, a step & repeat type inspection may be executed. The A/D converter 2 converts the output (gray level image signal) of the image sensor 1 to the digital image signal 9. This digital image signal 9 has a 10-bit constitution. Needless to say, if a signal is about 6 bits long, there is no special problem caused in image processing. However, to detect a minute defect, some amount of bits is necessary.

Firstly, image positioning in pixel units will be explained. In image positioning in pixel units, the gray level difference (the difference between the value of each pixel of an image and the value of corresponding pixel) is operated by shifting one of two images to be compared in pixel units and the dislocation amount where the gray level difference is minimized is obtained. The detection range of image dislocation amount is, for example, up to ±3 pixels and may be changed depending on the pattern design rule. When the position of one image is shifted by the obtained dislocation amount, the two images can be positioned.

Image positioning will be explained using the following.

$$S(\Delta x, \Delta y) = \Sigma |f(x,y) - g(x-\Delta x, y-\Delta y)| \quad (1)$$

Detection of dislocation is to detect $\Delta x$ and $\Delta y$ for minimizing the aforementioned $S(\Delta x, \Delta y)$.

However, the minimum position is obtained only in pixel units, so that depending on whether the true position is closer to $\Delta x$ or $\Delta y$ obtained, it is added as an offset.

According to the following formulas, $\Delta x$ and $\Delta y$ are added with 1 or left unchanged.

Namely:

$$\text{when } S(1,0)+S(1,-1)+S(0,-1) \text{ is minimum, } \Delta x++ \quad (2)$$

$$\text{when } S(-1,0)+S(-1,-1)+S(0,-1) \text{ is minimum, left unchanged} \quad (3)$$

$$\text{when } S(-1,0)+S(-1,-1)+S(0,-1) \text{ is minimum, } \Delta y++ \quad (4),$$

and $$\text{when } S(-1,0)+S(1,1)+S(0,1) \text{ is minimum, } \Delta x++, \Delta y++ \quad (5)$$

$\Delta x++$ means $\Delta x = \Delta x + 1$.

When the position of one image is always shifted by the obtained dislocation amount by positioning like this, two images can be positioned. Namely, an image f is always moved to the upper right and a new image f' is obtained and thus the moving direction can be specified to one kind from four kinds (lower right movement, upper left movement, lower left movement, upper right movement). This provides simplification of the hardware.

Figure 3:
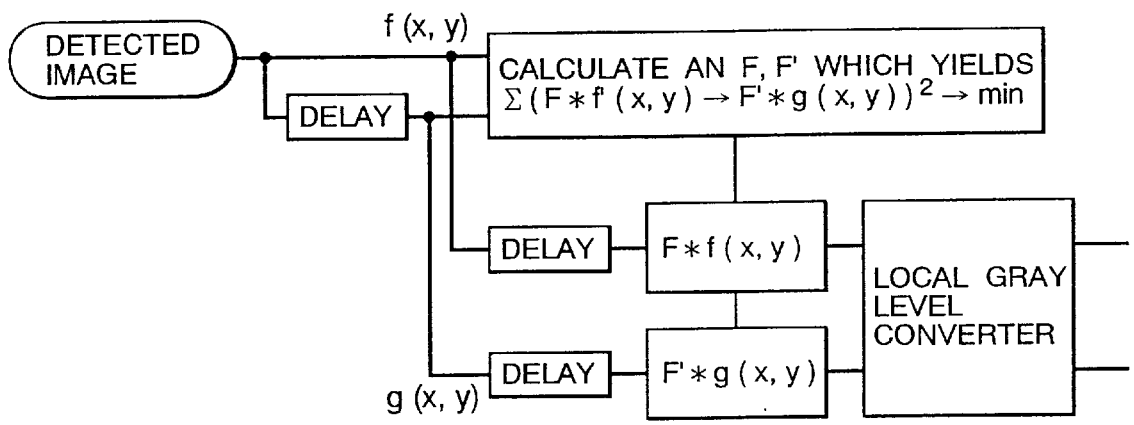
FIG. 3 is an illustration for a brightness equalizing filtering device.

FIG. 3 shows the brightness equalizing filtering device 12 in detail. Regarding two images f(x,y) and g(x,y) positioned in pixel units, filters F and F' for minimizing the following value in the images are obtained first.

$$\Sigma(F*f(x,y) - F'*g(x,y))^2 \quad (6)$$

The filters F and F' have a size of, for example, 2×2 pixels.

FIG. 5 shows an example of filter. The filters F and F' are symmetrical and dual as shown in the drawing. When the filters are made dual like this, the parameter coefficient of each filter can be obtained by the method of least squares.

$$\alpha = \{(\Sigma\Sigma C0*Cy)*(\Sigma\Sigma Cx*Cy) - (\Sigma\Sigma C0*Cx)*(\Sigma\Sigma Cy*Cy)\} / \{(\Sigma\Sigma Cx*Cx)*(\Sigma\Sigma Cy*Cy) - (\Sigma\Sigma Cx*Cy)*(\Sigma\Sigma Cx*Cy)\} \quad (7)$$

$$\beta = \{(\Sigma\Sigma C0*Cx)*(\Sigma\Sigma Cx*Cy) - (\Sigma\Sigma C0*Cy)*(\Sigma\Sigma Cx*Cx)\} / \{(\Sigma\Sigma Cx*Cx)*(\Sigma\Sigma Cy*Cy) - (\Sigma\Sigma Cx*Cy)*(\Sigma\Sigma Cx*Cy) \quad (8)$$

where:

$$C0 = f(x,y) - g(x,y) \quad (9)$$

$$Cx = \{f(x+1,y) - f(x,y)\} - \{g(x-1,y) - g(x,y)\} \quad (10)$$

$$Cy = \{f(x,y+1) - f(x,y)\} - \{g(x,y-1) - g(x,y)\} \quad (11)$$

In this system, the target two images are filtered and the square error of the gray level is minimized so as to equalize each brightness. The repetitive operation is not necessary and equalization can be realized by one operation.

The feature of the aforementioned system is that the filter coefficients α and β are obtained so that the gray levels of the two images are well equalized in the sense that the square error is minimized. Particularly, these parameters do not always indicate the true values of image dislocation amounts. For example, as described in the prior art, a system that a parabolic sphere surface is fitted to S(Δx, Δy), and the minimum position is calculated, and then an interpolated image is obtained by interpolation on the basis of this calculated position may be considered. However, regarding the brightness in this case, there is not any standard or condition to be satisfied and in this meaning, the use of an obtained image in the comparison inspection will not be guaranteed.

Furthermore, if the brightness is different, what the calculated dislocation indicates is not clear. In addition, even if the minimum position calculated by approximation to the parabolic sphere surface matches the position in the system described in this embodiment, it does not match that of an obtained image to be compared.

Figure 13:
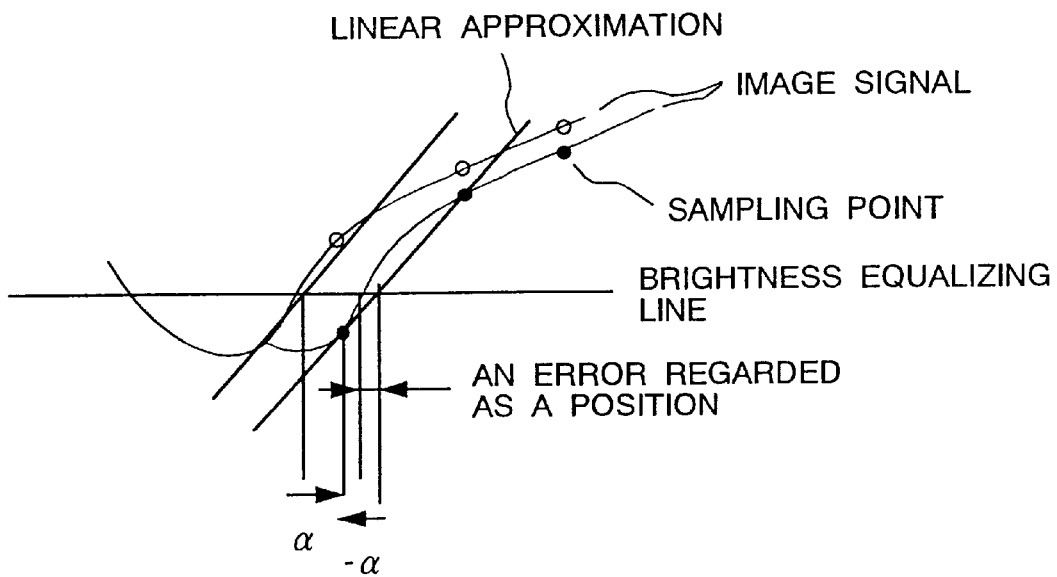
FIG. 13 is an illustration for the operation of a brightness equalizing filtering device of the present invention.
Figure 14:
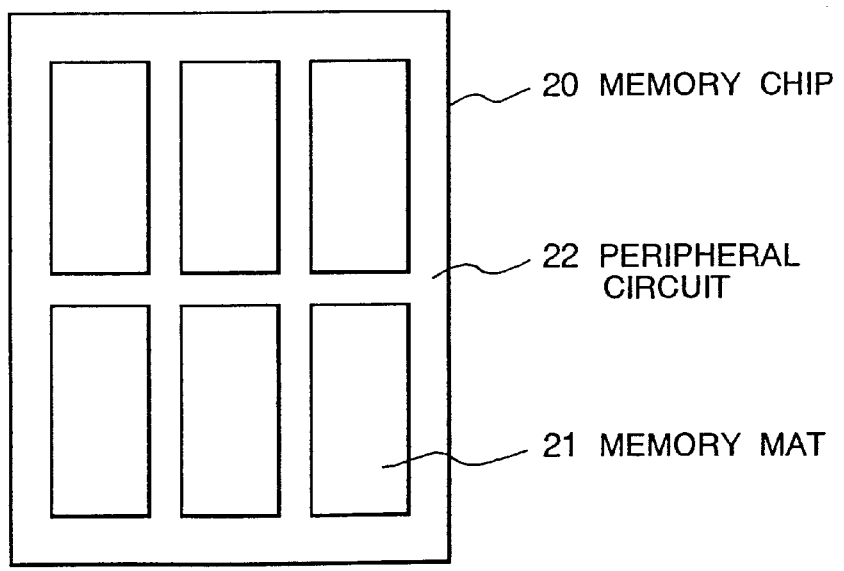
FIG. 14 is a schematic illustration of a memory mat and peripheral circuit in a memory chip of a pattern to be inspected.
Figure 15:
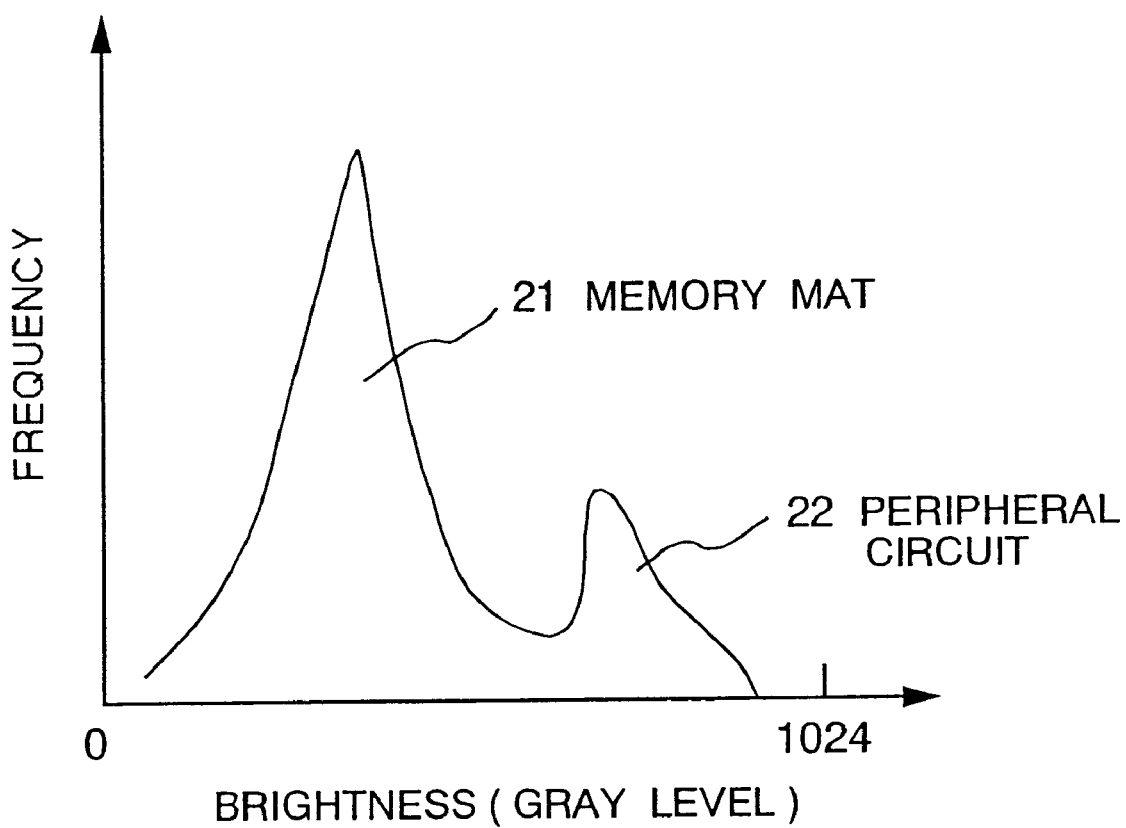
FIG. 15 is a histogram of the brightness in the memory mat and peripheral circuit in the memory chip shown in FIG. 10.
Figure 16:
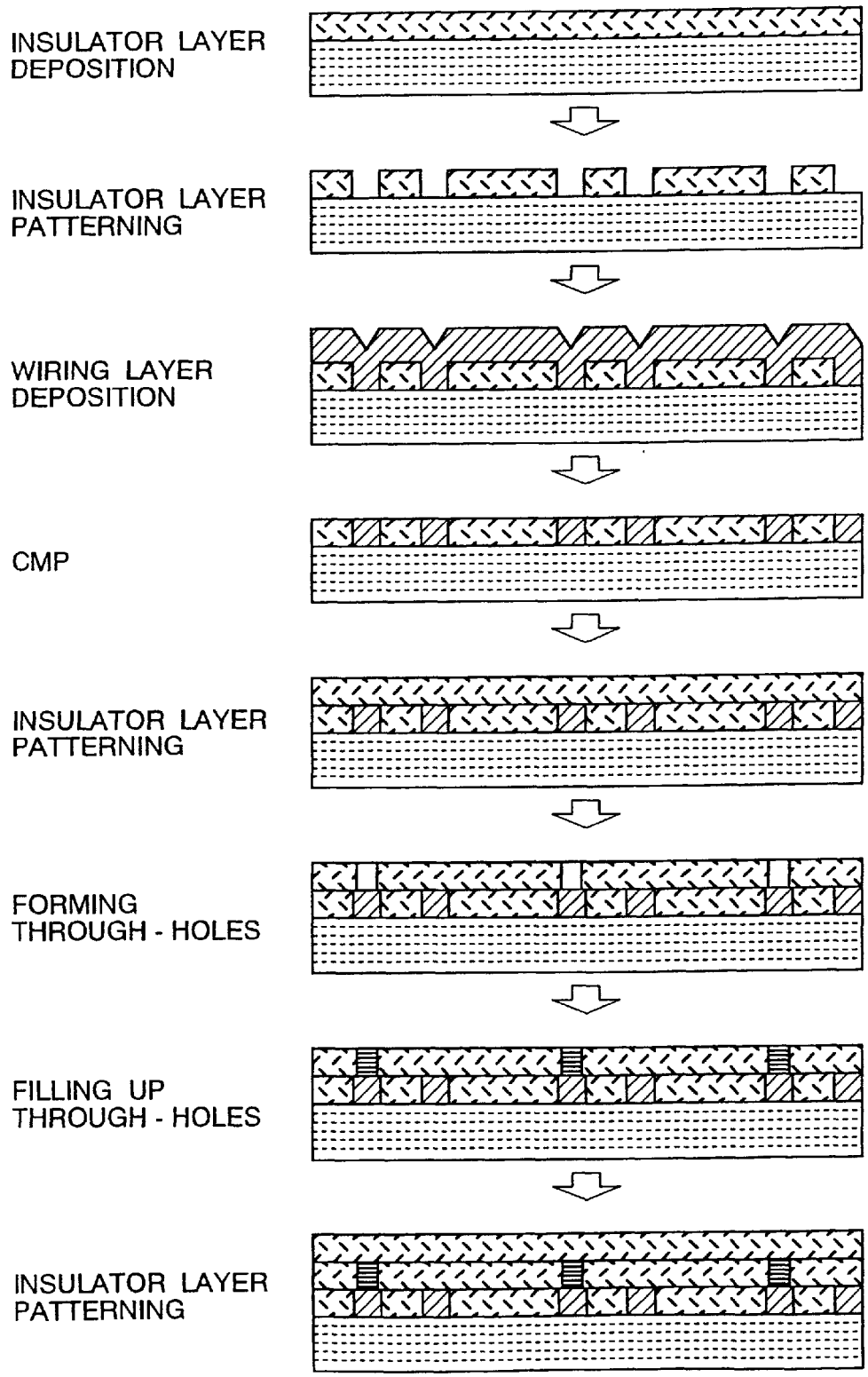
FIG. 16 is an illustration for the flow of the CMP process.
Figure 17:
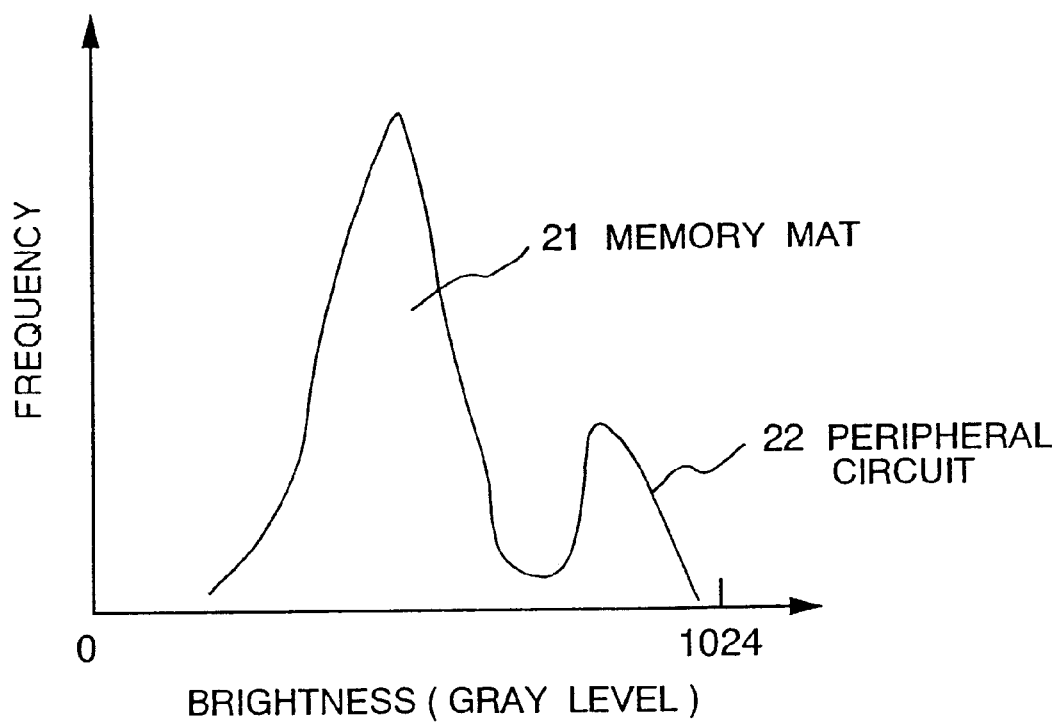
FIG. 17 is a histogram of the brightness in a memory mat and peripheral circuit in a different memory chip subjected to the CMP process.

The system explained in this embodiment guarantees that the square error of brightness of two images is minimized and draws a line between the system and other systems in this respect. As shown in FIG. 13, the system uses linear approximation, so that the filter coefficient α has an error if it is regarded as dislocation. However, each obtained brightness is equalized. This system may be considered that the difference in the gray level between images can be essentially made smaller and the system is very suitable for the comparison inspection.

Furthermore, the system has a feature that the filter coefficients α and β can be analytically calculated instead of repetitive operation and the system is suited to realize hardware.

Figure 4:
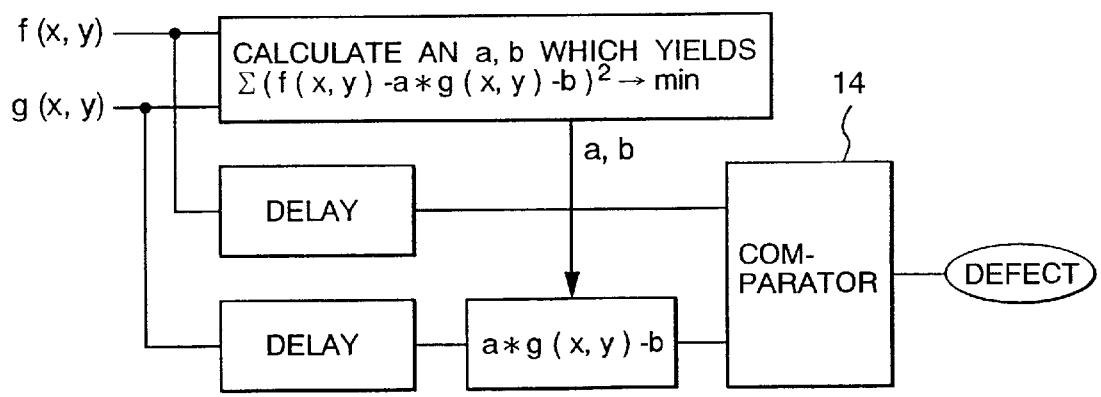
FIG. 4 is an illustration for a gray level converter.
Figure 6A:
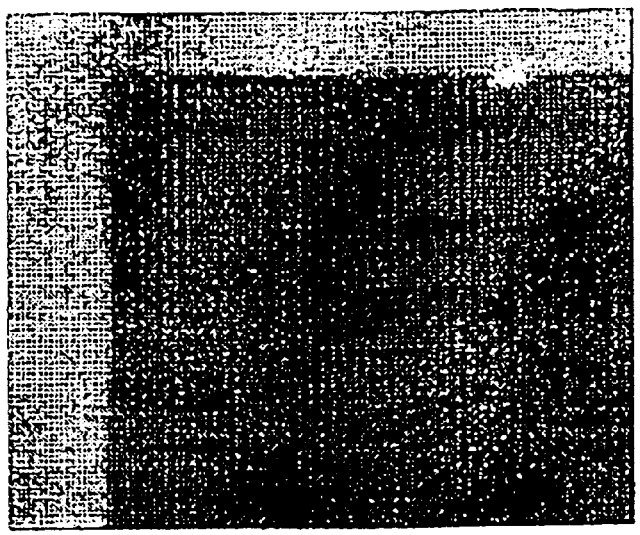
FIGS. 6A–6C are drawings showing an example of a detected image and a subtracted image of the present invention.
Figure 6B:
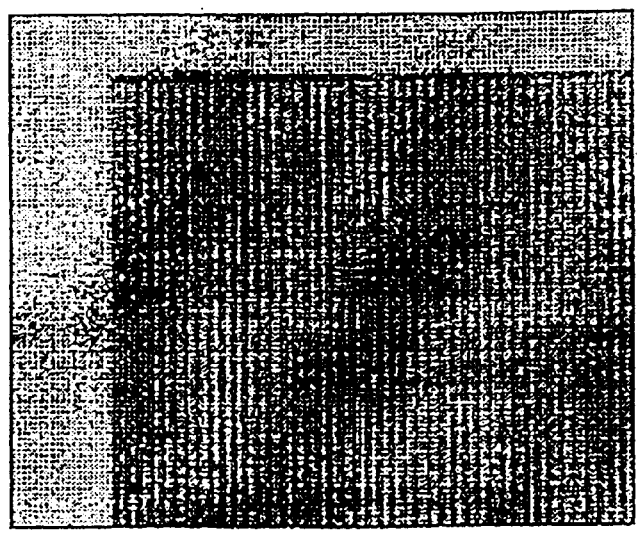
Figure 6C:
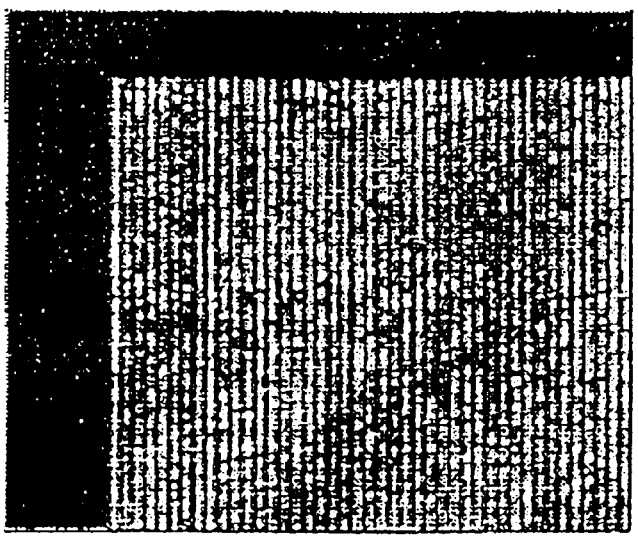

FIG. 4 shows the local gray level converter 13 in detail. Regarding two images f(x,y) and g(x,y) outputted by the brightness equalizing filtering device which are positioned in pixel units, the parameters a and b (a: equivalent to gain, b: equivalent to offset) for minimizing the following value are obtained in the predetermined area in the images first.

$$\Sigma(f(x,y)-a*g(x,y)-b)^2 \tag{12}$$

The parameters a and b are obtained by partially differentiating the above value by a and b and setting the values to 0. For example, the predetermined area is a range of 7×7 pixels around each point.

g(x,y) which is one of the image signals is converted to the following using the obtained parameters:

$$a*g(x,y)+b \tag{13}$$

By doing this, images having equalized brightness are obtained. The parameters a and b can take different values for each position (x,y).

$$a=(\Sigma(f(x,y)g(x,y))-\Sigma f(x,y)\ \Sigma g(x,y)/MN)/\ (\Sigma g(x,y)\ g(x,y)-\Sigma g(x,y)\ \Sigma g(x,y)/MN) \tag{14}$$

$$b=(\Sigma f(x,y)-a\Sigma g(x,y))/MN \tag{15}$$

where the number of pixels in the range of Σ is MN.

Furthermore, this is a method that the target central pixel and peripheral pixels are compared in brightness in the range of and when each brightness is greatly different, it may not be added.

Or, although addition is performed, it is valid to weight for addition and lower the contribution rate. For example, assuming the brightness of the target image at (x,y) as c and the brightness of another pixel in the range of Σ as d, the weight W(x,y) is set as follows:

$$W(x,y)=\max[1-(c-d)^2/(D*D),\ 0] \tag{16}$$

In this case, max[ ] indicates detection of the maximum value and c and d indicate brightness of 8-bit gray level. It is assumed that D=255. By doing this, when the target central pixel and peripheral pixels are similar in brightness, the weight is set to a value close to 1 and when they are not similar in brightness, the weight is set to a small value. Needless to say, there is no need to stick to such a function and any is acceptable if it can be appropriately weighted.

Figure 7A:
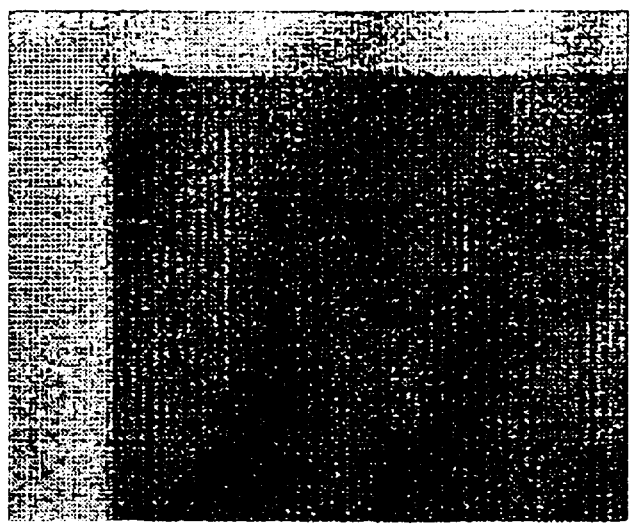
FIGS. 7(a) and 7(b) are drawings showing an example of a detected image and a subtracted image of the present invention.
Figure 7B:
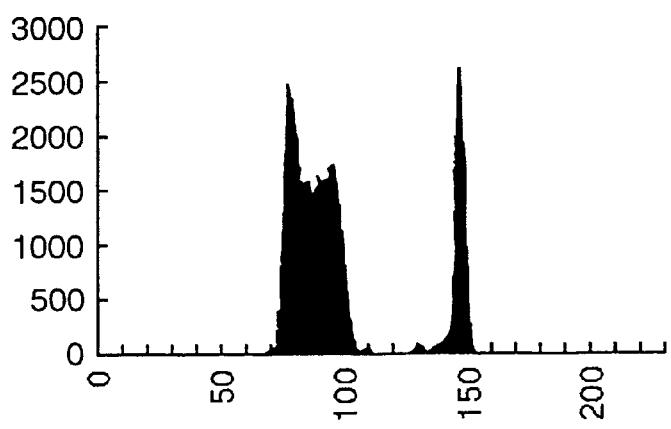
Figure 8A:
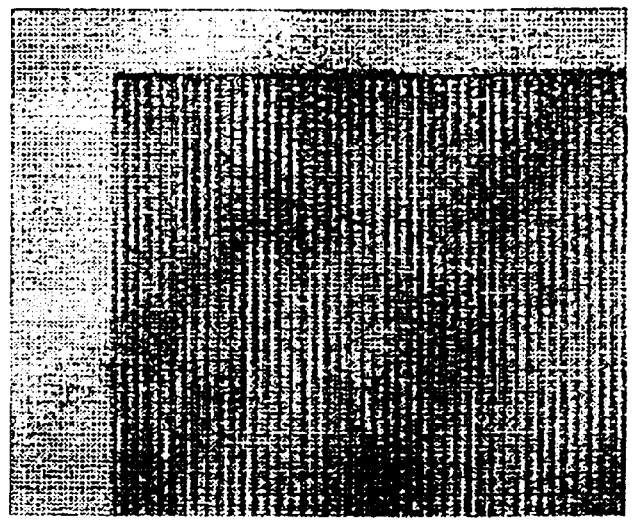
FIGS. 8(a) and 8(b) are drawings showing an example of a detected image and a subtracted image of the present invention.

FIGS. 7(a) and 7(b) and FIGS. 8(a) end 8(b) show examples of two detected images. The two detected images are greatly different in brightness as shown in the drawings. The two images are positioned with the pixel-wise accuracy and the brightness equalizing filter is operated. However, the difference in brightness between the images is too great and as shown in the drawings, a great mismatch is generated between the subtracted images. For these images, the gray level conversion is executed.

Figure 8B:
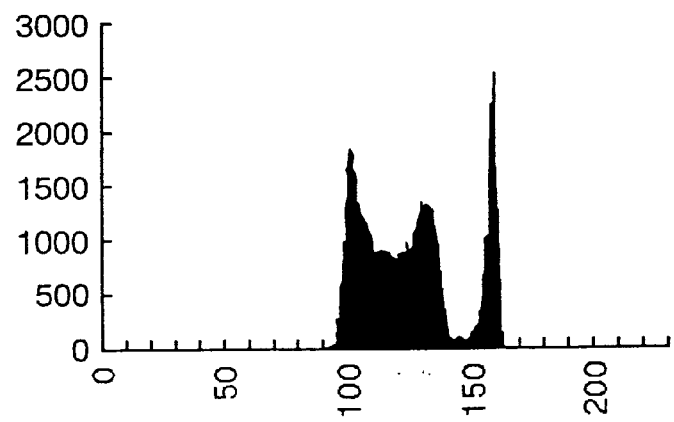
Figure 9A:
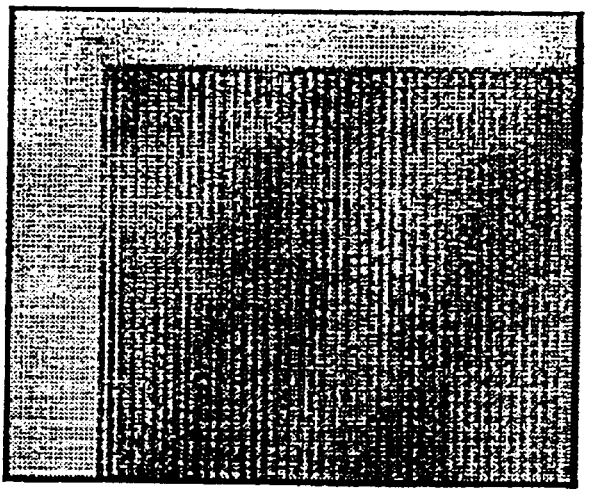
FIGS. 9(a) and 9(b) are drawings showing an example of a detected image and a subtracted image of the present invention.
Figure 9B:
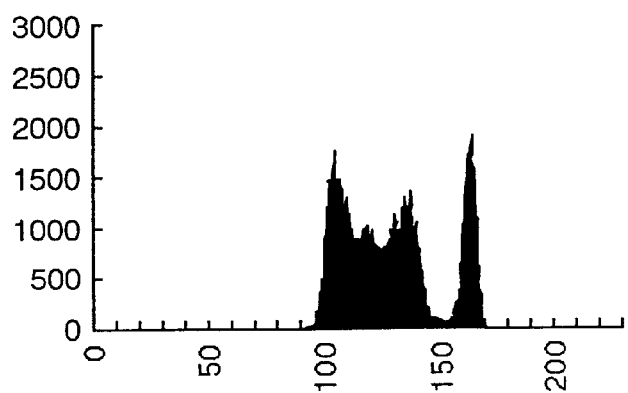

A processing example will be explained by referring to FIGS. 7(a) and 7(b). In this embodiment, D=70 is set. The predetermined area is a range of 7×7 pixels around each point. FIGS. 7(a) and 7(b) and FIGS. 8(a) and 8(b) show two detected images f(x,y) and g(x,y) and brightness histograms. Both drawings show that the images f(x,y) and g(x,y) and their brightness histograms are different from each other. On the other hand, FIGS. 9(a) and 9(b) show an image a*g(x, y)+b after conversion and its brightness histogram. It can be seen that the brightness histograms shown in FIGS. 8(b) and 9(b) are almost equalized by conversion. As an experimental result with the images shown in FIGS. 7(a) to 9(a), a=1.41 and b=0 are obtained at a point in the images. In the images, it is found that the gain of brightness is greatly different (41%) from each other.

From this example, a system that the offset is always set at 0 and only the gain is kept variable may be considered.

Figure 10A:
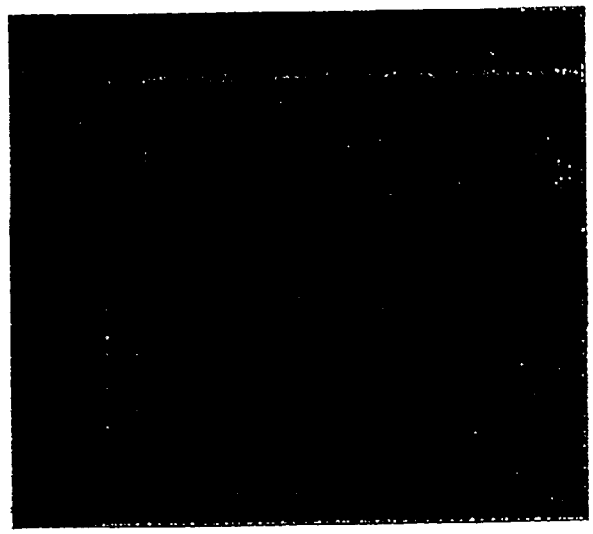
FIGS. 10(a) and 10(b) are drawings showing an example in which gray level conversion of the present invention is executed.
Figure 10B:
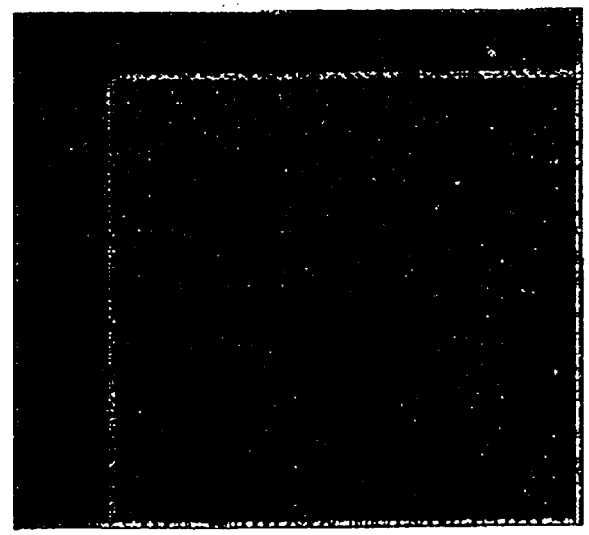
Figure 11A:
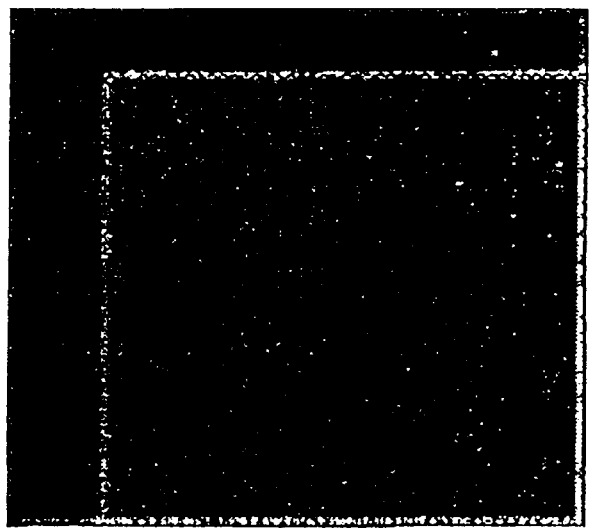
FIGS. 11(a) and 11(b) are drawings showing an example in which gray level conversion of the present invention is executed.
Figure 11B:
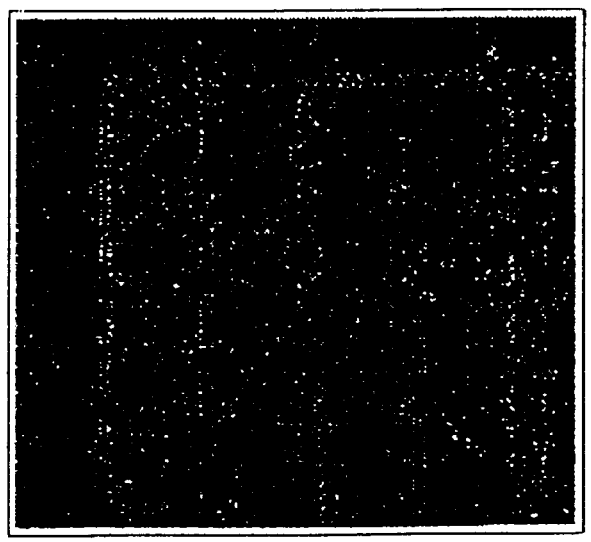

FIGS. 10 and 11 show differences in images obtained by such conversion. In these drawings, the predetermined areas are ranges of 3×3, 5×5, and 7×7 pixels around each point. The weight at this time is set as W(x,y)=1. Furthermore, with respect to the range of 7×7 pixels, the weight is set to the aforementioned W(x,y). These drawings show that when the area is small, the brightness is locally adjusted and the mismatch between images is made smaller. In this process, although the tolerance of brightness is spread, a minute defect may be missed. Therefore, it is necessary to spread the area depending on the defect to be detected. However, when the weight is fixed to 1, the boundary of the pattern region is detected as a mismatch, that is, as a false report. If it is weighted, the effect of the boundary is reduced and the brightnesses of two images are almost equalized and a minute defect also can be detected.

It is not always necessary that the area of 7×7 pixels is a square and it may be a rectangle, a polygon, or a circle.

As a weighting method, in addition to it, the target central pixel and peripheral pixels are compared in brightness and when the brightness difference is larger than the threshold, the weight may be set to 0.

In addition to the aforementioned, the following gray level conversion may be considered.

$$W(x,y)\ (\sigma f/\sigma g)\ (g(x,y)-mg)+mf \tag{17}$$

where σf and mf indicate the standard deviation and mean value in the predetermined area in the neighborhood of the point (x,y) in the image f(x,y) respectively and σg and mg indicate the standard deviation and mean value in the predetermined area in the neighborhood of the point (x,y) in the image g(x,y) respectively. By the aforementioned conversion, the brightness of the image g(x,y) can be equalized with that of the image f(x,y).

W(x,y) may be the aforementioned weight or the correlation coefficient of image data in the predetermined areas in the images f(x,y) and g(x,y).

This system also has a feature that the histograms of two images are equalized with each other as a result.

Both systems are of a form of linear conversion comprising a gain and offset.

The aforementioned gray level conversion is local brightness conversion in the neighborhood of the target pixel. Needless to say, the conversion may be applied to the whole image, that is, the whole 256 lines according to the object and image features. With respect to which one of two images is to be equalized with the other in brightness, for example, the mean value of brightness is calculated for each image and equalization to the brighter one can be selected. It is also possible to execute gray level conversion for both images and equalize them to each other. Furthermore, it is also possible to calculate the mean value of brightness for each predetermined area or for each point and equalize the brightness to the brighter one.

In FIG. 1, the gray level conversion is executed after the brightness equalizing filtering operation is performed. However, this order may be interchanged as shown in FIG. 2. The examination of the inventors shows that FIG. 2 is more sensitive to the difference in brightness.

Next, the comparator 14 may be of the system developed by the inventors, that is, the one described in Japanese Patent Laid-Open Application No. 61-212708, which comprises a subtracted image detection circuit, a mismatch detection circuit for binarizing a subtracted image with the predetermined threshold, and a feature extraction circuit for calculating the area, length (projected length), and coordinates from binarized output. The related disclosure of Japanese Patent Laid-Open Application No. 61-212708 is incorporated herein by reference.

Figure 12:
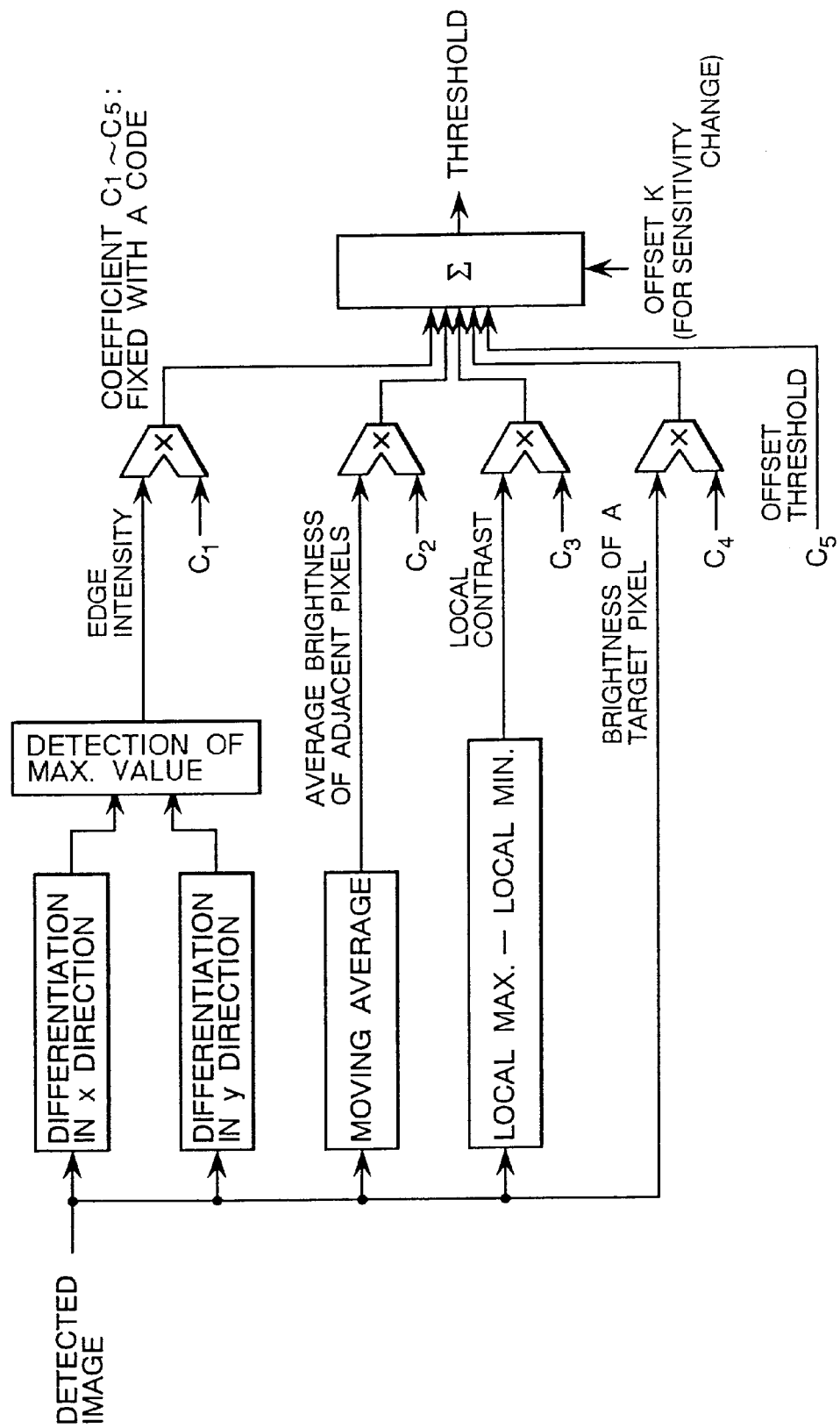
FIG. 12 is an illustration for a threshold setting system of the present invention.

Furthermore, setting of the threshold relating to the present invention will be explained by referring to FIG. 12.

As mentioned above, when a subtracted image is to be binarized, a false report is easily generated. Therefore, as shown in FIG. 12, the difference between the maximum value and the minimum value in the local region of an image, mean value, and differential value x or y, whichever the larger are calculated for each point. When these values are multiplied by a parameter separately predetermined and added, that is, the socalled multiplication and addition are performed, a threshold is generated. By doing this, for example, where the change in brightness of the boundary of the region is large, the differential value increases, so that the threshold increases and an occurrence of a false report can be prevented. Needless to say, there is no need to provide all the three of the difference between the maximum value and the minimum value, mean value, and differential value x or y, whichever the larger and even one of them is acceptable. For example, when the aforementioned gray level conversion is executed, there is no need to calculate the mean value.

When the difference between images is binarized using such a threshold, the problem of a false report can be reduced more effectively.

In FIG. 1 or 2, when the coordinates of the array data in the chip on the semiconductor wafer 4 which is obtained on the basis of the design information are inputted from an external storage via an input device 15 comprising a keyboard and disk or a communication means which is not shown in the drawing, a CPU 16 creates defect inspection data on the basis of the inputted coordinates of the array data in the chip on the semiconductor wafer 4 and stores it in a storage 17.

This defect inspection data can be displayed on a display means such as a display as required and can be outputted to an external storage or processor by a communication means not shown in the drawing.

By doing this, images can be compared with extremely high precision and the object intended by the present invention can be realized highly sensitively.

Embodiment 2

Figure 18:
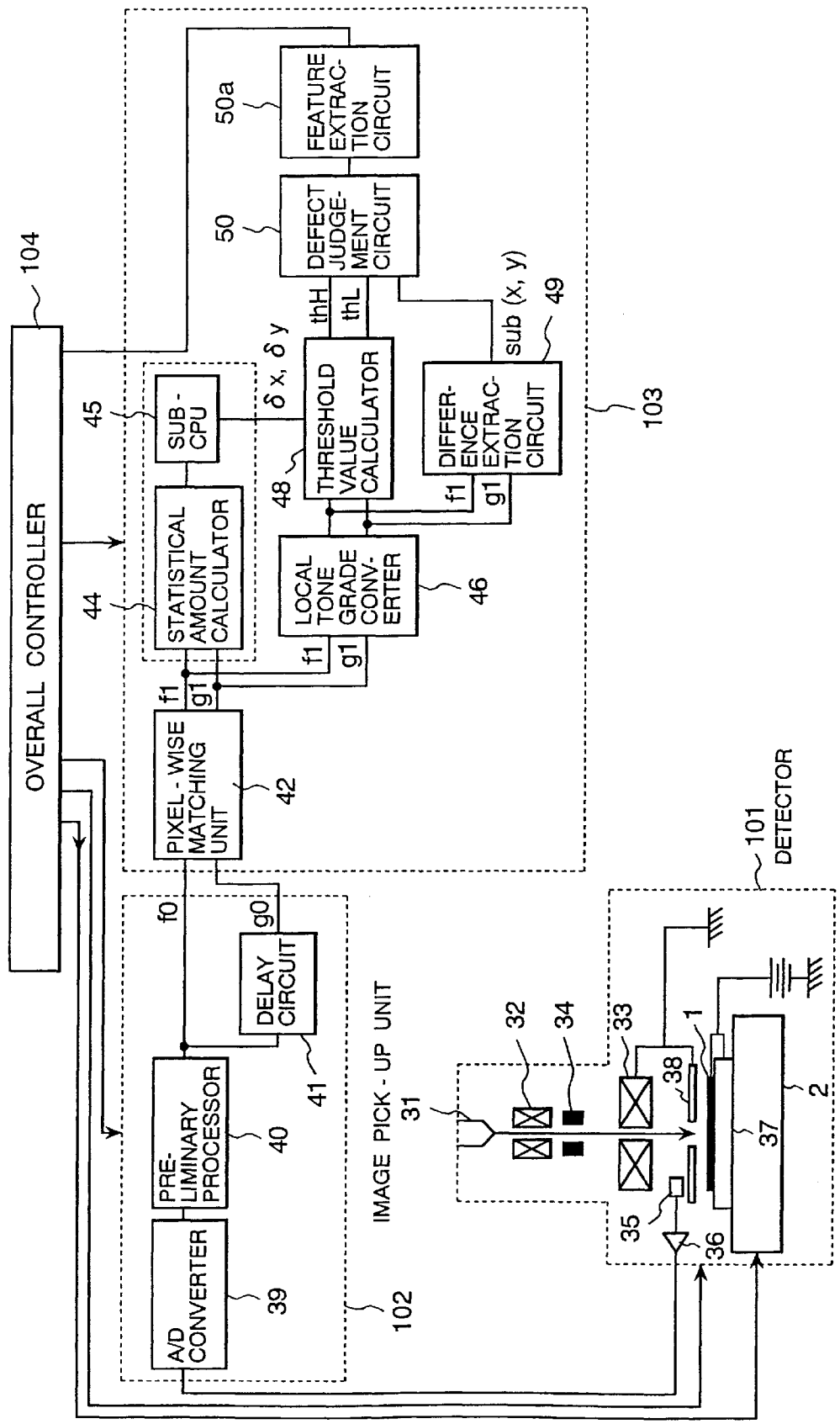
FIG. 18 is a block diagram of a defect inspection apparatus for a pattern to be inspected of an embodiment of the present invention.

The second embodiment of the pattern inspection method and apparatus therefor of the present invention is shown in FIG. 18. In this embodiment, a sample is scanned by an electron beam, and electrons generated from a wafer by irradiation of an electron beam are detected, and an electron image of the scanning portion is obtained according to the intensity change, and the pattern is inspected using the electron image. The aforementioned problem to be solved by the present invention is dealt with by the second embodiment by setting the threshold for defect judgment for each pixel in consideration of the pattern dislocation and gray level difference.

The system comprises a detector 101, an image pick-up unit 102, an image processor 103, and an overall controller for controlling the whole system.

Firstly, the detector 101 will be described.

In FIG. 18, an electron beam emitted from an electron gun 31 is limited to a beam diameter similar to the pixel size on the sample surface via a magnetic field lens 32 and an object lens 33. In this case, a negative potential is applied to the sample by a grounded electrode 37 and a retarding electrode 38 and a high resolution is realized in the low acceleration voltage region by decelerating the electron beam between the object lens and the sample. When the electron beam is irradiated, electrons are generated from the sample (wafer 1). When electrons generated from the sample are detected by a deflector 34 in synchronization with repetitive scanning of the electron beam in the X direction and continuous movement of the sample in the Y direction by the stage 2, a two-dimensional electron beam image of the sample is obtained. Electrons generated from the sample are seized by a detector 35 and amplified by an amplifier 36. In this case, to realize high-speed inspection, as the deflector 34 for repetitively scanning an electron beam in the X direction, it is desirable to use an electrostatic deflector having a fast deflection speed, and as the electron gun 31, it is desirable to use an electric field emission type electron gun for shortening the irradiation time because the electron beam current can be increased, and as the detector 35, it is desirable to use a semiconductor detector for enabling high-speed driving.

Next, the image pick-up unit 102 will be described.

A signal amplified by the amplifier 36 is converted to a digital signal by an A/D converter 39, subjected to dark level correction (the mean of gray levels of the specified number of pixels during the beam blanking period is referred to as a dark level), to fluctuation correction of the electron beam current (the beam current is detected by an object iris not shown in the drawing and the signal is normalized by the beam current), and to shading correction (the light quantity fluctuation due to the beam scanning position is corrected) in a preliminary processor 40, and then filtered by a Gaussian filter, mean value filter, or edge emphasis filter so as to improve the image quality. The distortion of an image is corrected as required. These preliminary processes are performed so as to convert a detected image so that it will be advantageous in the later defect judgment process. A delay circuit 41 delays a signal by a fixed time. When the delay time is set to, for example, the time required for the stage 2 to move by the chip pitch, a delayed signal g0 and a non-delayed signal f0 become image signals at the same location of the adjacent chips and this is the aforementioned chip comparison inspection. Or, when the delay time is set to the time required for the stage 2 to move by the pitch of the memory cell, the delayed signal g0 and the non-delayed signal f0 become image signals at the same location of the adjacent memory cells and this is the aforementioned cell comparison inspection. By doing this, the image signals f0 and g0 to be compared are picked up from the image pick-up unit 102. Hereinafter, f0 is called a detected image and g0 is called a compared image.

Next, the process of the image processor 103 will be described.

A pixel-wise matching unit 42 shifts the position of the compared image so that the position where the matching degree is maximized between the detected image and the compared image exists between the pixels 0 and 1 on a basis of the position of the detected image.

Next, the filters F and F' for minimizing the mismatch of brightness between images in the brightness equalizing filtering device will be obtained. As mentioned above, the parameter coefficient of each filter is obtained by the method of least squares.

$$\alpha = \{(\Sigma\Sigma C0*Cy)*(\Sigma\Sigma Cx*Cy)-(\Sigma\Sigma C0*Cx)*(\Sigma\Sigma Cy*Cy)\}/\{(\Sigma\Sigma Cx*Cx)*(\Sigma\Sigma Cy*Cy)-(\Sigma\Sigma Cx*Cy)*(\Sigma\Sigma Cx*Cy)\} \quad (18)$$

$$\beta = \{(\Sigma\Sigma C0*Cx)*(\Sigma\Sigma Cx*Cy)-(\Sigma\Sigma C0*Cx)*(\Sigma\Sigma Cx*Cx)\}/\{(\Sigma\Sigma Cx*Cx)*(\Sigma\Sigma Cy*Cy)-(\Sigma\Sigma Cx*Cy)*(\Sigma\Sigma Cx*Cy)\} \quad (19)$$

where:

$$C0 = f1(x,y) - g1(x,y) \quad (20)$$

$$Cx = \{f1(x+1,y) - f1(x,y)\} - \{g1(x-1,y) - g1(x,y)\} \quad (21)$$

$$Cy = \{f1(x,y+1) - f1(x,y)\} - \{g1(x,y-1) - g1(x,y)\} \quad (22)$$

To obtain dx0 and dy0 as shown in Formulas (18) and (19), it is necessary to obtain various statistics $\Sigma\Sigma xx$. Those various statistics are calculated by a statistical amount calculator 44 and $\alpha$ and $\beta$ are obtained by operating Formulas (18) and (19) using $\Sigma\Sigma xx$ calculated by a sub-CPU 45.

A local gray level converter 46 executes the gray level conversion for equalizing the brightnesses of the aforementioned f1 and g1.

A difference extraction circuit 49 obtains a subtracted image sub(x,y) of f1 and g1. It is formulated as follows.

$$sub(x,y) = g1(x,y) - f1(x,y) \quad (23)$$

Figure 19:
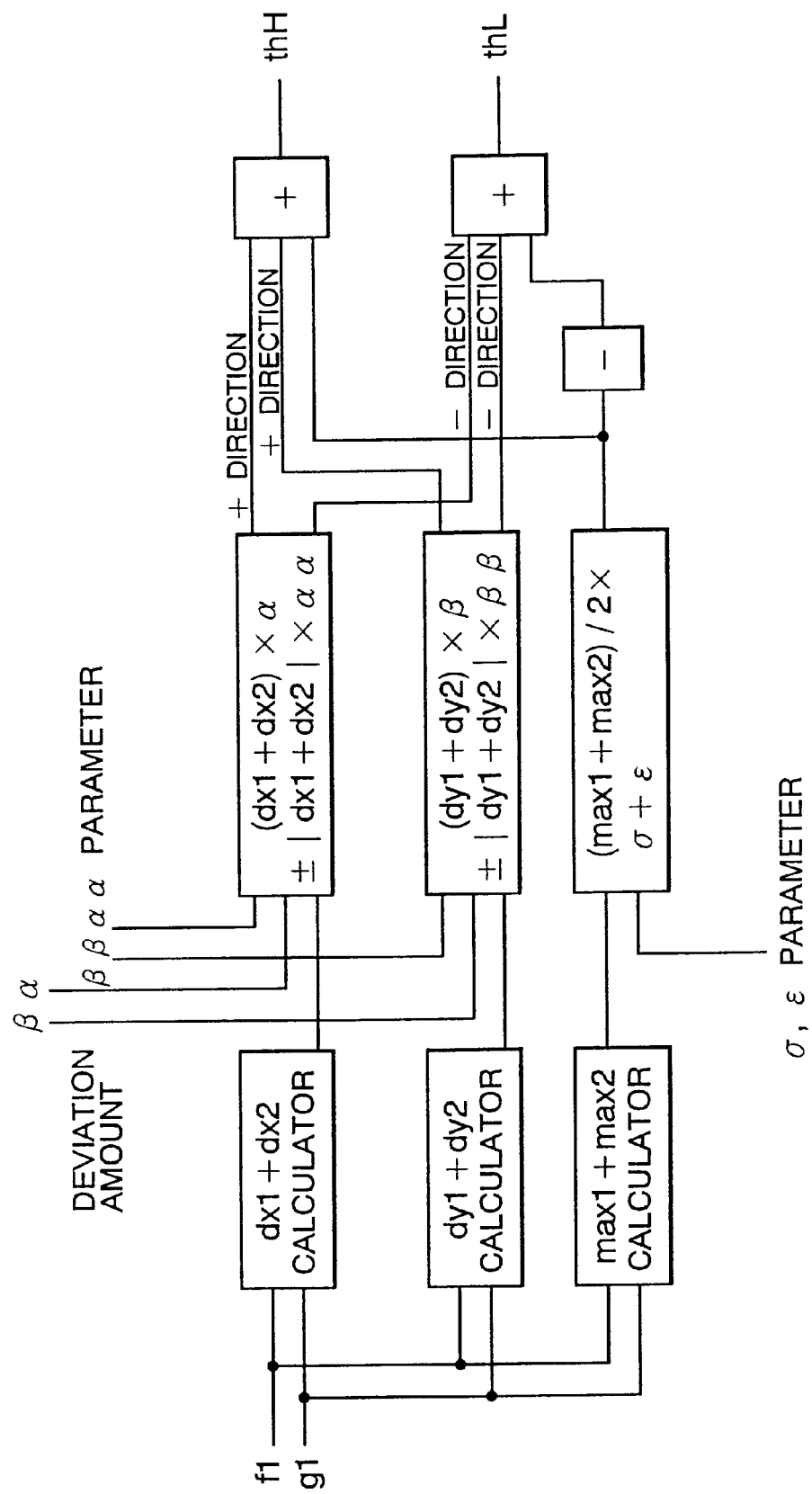
FIG. 19 is an illustration for the constitution of a threshold value calculator.

A threshold value calculator 48 calculates two threshold values thH(x,y) and thL(x,y) for deciding whether it is a defect candidate or not depending on the value of sub(x,y) using the image signals f1 and g1 via the delay circuits 46 and 47 and $\alpha$ and $\beta$. thH(x,y) is a threshold for specifying the lower limit of sub(x,y). The constitution of the threshold value calculator 48 is shown in FIG. 19. The contents of operations are expressed by the following formulas.

$$thH(x,y) = A(x,y) + B(x,y) + C(x,y) \quad (24)$$

$$thL(x,y) = A(x,y) - B(x,y) - C(x,y) \quad (25)$$

where:

$$A(x,y) = \{dx1(x,y)* \beta - dx2(x,y)*(-\beta)\} + \{dy1(x,y)* \beta - dy2(x,y)*(-\beta)\} = \{dx1(x,y) + dx2(x,y)\}*\alpha + \{dy1(x,y) + dy2(x,y)\}*\beta \quad (26)$$

$$B(x,y) = |\{dx1(x,y)* a\ a - dx2(x,y)*(-a\ a)\}| + |\{dy1(x,y)* b\ b - dy2(x,y)*(-b\ b)\}| = |\{dx1(x,y) + dx2(x,y)\}* a\ a| + |\{dy1(x,y) + dy2(x,y)\}* b\ b| \quad (27)$$

$$C(x,y) = (max1 + max2)/2 * \gamma + \epsilon \quad (28)$$

where a a and b b indicate real numbers of 0 to 0.5, and $\gamma$ indicates a real number of 0 or more, and $\epsilon$ indicates an integer of 0 or more.

$$dx1(x,y) = f1(x+1,y) - f1(x,y) \quad (29)$$

$$dx2(x,y) = g1(x,y) - g1(x-1,y) \quad (30)$$

$$dy1(x,y) = f1(x,y+1) - f1(x,y) \quad (31)$$

$$dy2(x,y) = g1(x,y) - g1(x,y-1) \quad (32)$$

$$max1 = max\{f1(x,y), f1(x+1,y), f1(x,y+1), f1(x+1,y+1)\} \quad (33)$$

$$max2 = max\{g1(x,y), g1(x-1,y), g1(x,y-1), g1(x-1,y-1)\} \quad (34)$$

The first term A(x,y) of Formulas (24) and (25) for calculating threshold values is a term for correcting threshold values in correspondence with $\alpha$ and $\beta$ obtained by the dislocation detector 43. For example, dx1 expressed by Formula (29) is regarded as a local change rate of the gray level of f1 in the x direction and dx1(x,y) *$\alpha$ may be regarded as an estimated value of change of the gray level of f1 when the position is shifted by $\alpha$. Therefore, the first term $\{dx1(x,y) *\alpha - dx2(x,y)*(-\alpha)\}$ of A(x,y) may be regarded as an expected value of change of the gray level of a subtracted image of f1 and g1 for each pixel when the position of f1 is shifted by $-\alpha$ in the x direction and the position of g1 is shifted by $\alpha$. The second term also may be regarded as an estimated value in the y direction. The first term A(x,y) of threshold is a term for canceling $\alpha$ and $\beta$.

The second term B(x,y) of Formulas (24) and (25) for calculating threshold values is a term for permitting a minute dislocation of the pattern edge, a minute difference in the pattern shape, and a pattern distortion.

The comparison between Formula (25) for obtaining A(x,y) and Formula (27) for obtaining B(x,y) shows that B(x,y) is an absolute value of an estimate of change of the gray level of a subtracted image by a a and b b. Assuming that the known dislocation (regarded) is canceled by A(x,y), addition of B(x,y) to A(x,y) means that the position is further shifted (regarded) by a a in the x direction from the positioned state and by b b in the y direction. Namely, B(x,y) permits dislocation by a a in the x direction and by b b in the y direction. Subtraction of B(x,y) from A(x,y) means that the position is further shifted by $-a$ a in the x direction from the positioned state and by $-b$ b in the y direction. B(x,y) permits dislocation by $-a$ a in the x direction and by $-b$ b in the y direction. When the threshold is provided with the upper limit and lower limit, dislocations of $\pm a$ a and $\pm b$ b are permitted. When the parameters a a and b b are set to appropriate values, the permissible dislocation amount can be freely controlled.

The third term C(x,y) of Formulas (24) and (25) for calculating threshold values is a term for permitting a minute difference in the gray level. Addition of C(x,y) means that it is permitted that the gray level of g1 is larger than the gray level of f1 by C(x,y) and subtraction of C(x,y) means that it is permitted that the gray level of g1 is smaller than the gray level of f1 by C(x,y). In this embodiment, C(x,y) is the sum of a value obtained by multiplying the representative (max. value in this case) of the gray level in the local region by the proportional constant $\gamma$ and the constant $\epsilon$. However, there is no need to stick to this function and if the changing way of the gray level is known, a function suited to it may be used. For example, if it is found that the range of variation is proportional to the square root of the gray level, it is necessary to use $C(x,y)=(max1+max2)^{1/2}*\gamma+\epsilon$ for Formula (28). In the same way as with B(x,y), the permissible difference in the gray level can be freely controlled by the parameters $\gamma$ and $\epsilon$.

The defect judgment circuit 50 judges the pixel at the position (x,y) as a non-defect candidate when Formula (35) is satisfied using the output sub(x,y) of the difference extraction circuit 49 and the outputs thL(x,y) and thH(x,y) of the threshold value calculator 48 and the pixel at the position (x,y) as a defect candidate when it is not satisfied.

$$thL(x,y) \leq sub(x,y) \leq thH(x,y) \quad (35)$$

The defect judgment circuit 50 outputs 0 for a non-defect candidate pixel and def(x,y) having a value of 1 or more for a defect candidate pixel.

The feature extraction circuit 50a deletes noise output by the noise removal process (for example, a process of contraction and expansion for def(x,y)) and then performs a defect candidate portion merging process for merging neighboring defect candidate portions. Thereafter, the feature extraction circuit 50a calculates feature values such as gravity center coordinates, X and Y projected lengths, and area for each block.

The overall controller 104 converts the coordinates of a defect portion to the coordinate system on the sample, deletes a pseudo defect, and finally merges defect data comprising the position on the sample and feature values. The defect data is sent to an external storage or data processor by a communication means not shown in the drawing. The defect data can be displayed on a display means such as a display.

According to this embodiment, a dislocation as a whole small region, a minute dislocation of each pattern edge, and a minute difference in the gray level are permitted, so that a normal portion will not be misrecognized as a defect. A dislocation and the tolerance of variation in the gray level can be easily controlled by the parameters a a, b b, $\gamma$, and $\epsilon$.

According to Embodiments 1 and 2 of the present invention, a defect can be detected highly sensitively without being affected by the difference in pattern brightness depending on the location. Therefore, even in a pattern in which the internal brightness greatly varies in a dark region such as the memory mat 21, a defect can be detected highly sensitively. Therefore, as compared with the conventional inspection, a highly reliable inspection can be realized.

In the aforementioned embodiments of the present invention, the comparison inspection method mainly using an optical microscope or scan type electron microscope is described. However, needless to say, even when it is used to detect an image obtained by infrared rays or X-rays, it is also effective.

The constitution of the present invention produces an effect that a defect can be detected highly sensitively unless the overall detection sensitivity is restricted by the difference in the detected image brightness caused by the difference in the film thickness of a multilayer pattern or the difference in the image brightness of a pattern due to the location.

Highly accurate image matching can be executed.

The invention claimed is:

1. A defect inspection method comprising:
    a step of imaging a sample having a plurality of patterns formed so as to be identical and obtaining a first pattern image;
    a step of imaging said sample and obtaining a second pattern image;
    a step of converting the gray level of at least one of said first pattern image and said second pattern image; and
    a step of detecting a defect of said sample using said at least one image whose gray level is converted and the other image.

2. A defect inspection method according to claim 1, wherein said step of converting the gray level comprises:
    a step of converting said gray level so that the brightness of an image signal of said image whose gray level is converted is almost identical to the brightness of said other image by linear conversion having a gain and offset.

3. A defect inspection method according to claim 2, wherein said gain and offset are decided so that the error of square of the difference between the brightness of said image whose gray level is converted and the brightness of said other image is minimized.

4. A defect inspection method according to claim 1, wherein both said first pattern image and said second pattern image are optical images.

5. A defect inspection method according to claim 1, wherein both said first pattern image and said second pattern image are secondary charged particle images.

6. A defect inspection method according to claim 1, wherein each pattern of said first and second pattern images is a pattern in a semiconductor chip having a mat comprising a repetitive pattern region which is a cell and a peripheral circuit which is a non-repetitive pattern region.

7. A defect inspection method according to claim 6, wherein said semiconductor chip is subjected to the CMP (chemical mechanical polishing) process.

8. A defect inspection method according to claim 6, wherein said step of detecting a defect comprises:
    a step of convoluting said image whose gray level is converted and said other image with a dual filter and calculating the filter coefficient so as to minimize the sum of squares of differences; and
    a step of comparing said images by a process of convoluting said two images with the filter on the basis of said filter coefficient.

9. A defect inspection method according to claim 1, wherein said step of converting the gray level converts the gray level for each local region of at least one of said first and second pattern images.

10. A defect inspection method comprising:
    a step of imaging a sample having a plurality of patterns formed so as to be identical and obtaining a first pattern image;
    a step of imaging said sample and obtaining a second pattern image;
    a step of correcting the deviation between said first pattern image and said second pattern image;
    a step of converting the gray level of at least one of said first pattern image and said second pattern image in which said deviation is corrected; and
    a step of detecting a defect of said sample using said at least one image whose gray level is converted and the other image.

11. A defect inspection method according to claim 10, wherein both said first pattern image and said second pattern image are optical images.

12. A defect inspection method according to claim 10, wherein both said first pattern image and said second pattern image are secondary charged particle images.

13. A defect inspection apparatus Comprising:
an imager for enlarging and imaging an image of a sample having a plurality of patterns formed so as to be identical by an optical system and obtaining an enlarged image of a first pattern of said sample and an enlarged image of a second pattern;
gray level conversion means having a gray level comparator for comparing said enlarged image of first pattern and said enlarged image of second pattern in the gray level which are imaged and obtained by said imager for converting the gray level of at least one of said enlarged image of first pattern and said enlarged image of second pattern on the basis of the output of said gray level comparator; and
a defect detector having a comparator for comparing said at least one image whose gray level is converted by said gray level conversion means and said other image for detecting a defect of said sample using the output of said comparator.

14. A defect inspection apparatus according to claim 13, wherein said gray level conversion means comprises:
means for converting said gray level so that the brightness of an image signal of said enlarged image whose gray level is converted is almost identical to the brightness of said other enlarged image by linear conversion having a gain and offset.

15. A defect inspection apparatus according to claim 14, wherein said gain and offset are decided so that the error of square of the difference between the brightness of said image whose gray level is converted and the brightness of said first or second pattern image is minimized.

16. A defect inspection apparatus according to claim 13, wherein both said first pattern image and said second pattern image are optical images.

17. A defect inspection apparatus according to claim 13, wherein both said first pattern image and said second pattern image are charged particle images.

18. A defect inspection apparatus according to claim 13, wherein each pattern of said first and second pattern images comprises:
a pattern in a semiconductor chip having a mat comprising a repetitive pattern region which is a cell and a peripheral circuit which is a non-repetitive pattern region.

19. A defect inspection apparatus according to claim 18, wherein said semiconductor chip is subjected to the CMP (chemical mechanical polishing) process.

20. A defect inspection apparatus according to claim 18, wherein said defect detector comprises:
a unit for convoluting said image whose gray level is converted and said other image with a dual filter and calculating the filter coefficient so as to minimize the sum of squares of differences; and
a unit for comparing said images by a process of convoluting said two images with the filter on the basis of said filter coefficient.

21. A defect inspection apparatus according to claim 13, wherein said gray level conversion means converts the gray level for each local region of at least one of said enlarged images of said first and second patterns.

22. A defect inspection apparatus comprising:
an imager for imaging an image of a sample having a plurality of patterns formed so as to be identical by an optical system and obtaining an image of a first pattern of said sample and an image of a second pattern;
a corrector having an arithmetic circuit for calculating the deviation between said image of first pattern and said image of second pattern which are imaged and obtained by said imager for correcting said deviation between said image of first pattern and said image of second pattern which is calculated by said arithmetic circuit;
gray level conversion means having a gray level comparator for comparing said image of first pattern and said image of second pattern in which said deviation is corrected by said deviation corrector in the gray level for converting the gray level of at least one of said image of first pattern and said image of second pattern on the basis of the output of said gray level comparator; and
a defect detector having a comparator for comparing said at least one image whose gray level is converted by said gray level conversion means and said other image for detecting a defect of said sample using the output of said comparator.

23. A defect inspection apparatus comprising:
imaging means for imaging a sample having a plurality of patterns formed so as to be identical and obtaining a first pattern image and a second pattern image;
gray level conversion means for converting the gray level of at least one of said first pattern image and said second pattern image which are imaged and obtained by said imaging means; and
defect detection means for detecting a defect of said sample using said at least one image whose gray level is converted by said gray level conversion means and said other image.

24. A defect inspection apparatus according to claim 23, wherein said gray level conversion means comprises:
means for converting said gray level so that the brightness of an image signal of said image whose gray level is converted is almost identical to the brightness of said other image by linear conversion having a gain and offset.

25. A defect inspection apparatus according to claim 24, wherein said gain and offset are decided so that the error of square of the difference between the brightness of said one image whose grey level is converted and the brightness of said first or second pattern image.

26. A defect inspection apparatus according to claim 23, wherein both said first pattern image and said second pattern image are optical images.

27. A defect inspection apparatus according to claim 23, wherein both said first pattern image and said second pattern image are secondary charged particle images.

28. A defect inspection apparatus according to claim 23, wherein each pattern of said first and second pattern images is a pattern in a semiconductor chip having a mat comprising a repetitive pattern region which is a cell and a peripheral circuit which is a non-repetitive pattern region.

29. A defect inspection apparatus according to claim 23, wherein said sample is a semiconductor chip which is subjected to the CMP (chemical mechanical polishing) process.

30. A defect inspection apparatus according to claim 23, wherein said sample is a semiconductor chip, and said defect detection means comprises:

means for convoluting said image whose gray level is converted and said other image with a dual filter and calculating the filter coefficient so as to minimize the sum of squares of differences; and means for comparing said images by a process of convoluting said two images with the filter on the basis of said filter coefficient.

31. A defect inspection apparatus according to claim 23, wherein said gray level conversion means converts the gray level for each local region of at least one of said first and second pattern images.

32. A defect inspection apparatus comprising:

imaging means for imaging a sample having a plurality of patterns formed so as to be identical and obtaining a first pattern image and a second pattern image;

correction means for correcting a deviation between said first pattern image and said second pattern image which are imaged and obtained by said imaging means;

gray level conversion means for converting the gray level of at least one of said first pattern image and said second pattern image in which said deviation is corrected by said deviation correction means; and defect detection means for detecting a defect of said sample using said at least one image whose gray level is converted by said gray level conversion means and said other image.

\* \* \* \* \*